United States Patent
Cho (10) Patent No.: US 7,022,576 B2
(45) Date of Patent: Apr. 4, 2006

(54) METHOD OF MANUFACTURING A SEMICONDUCTOR DEVICE

(75) Inventor: Yong Soo Cho, Daejeon-Metropolitan (KR)

(73) Assignee: DongbuAnam Semiconductor Inc., Seoul (KR)

(*) Notice: Subject to any disclaimer, the term of this patent is extended or adjusted under 35 U.S.C. 154(b) by 78 days.

(21) Appl. No.: 10/737,988

(22) Filed: Dec. 18, 2003

(65) Prior Publication Data
US 2004/0126976 A1 Jul. 1, 2004

(30) Foreign Application Priority Data
Dec. 30, 2002 (KR) ............... 10-2002-0087286

(51) Int. Cl.
*H01L 21/336* (2006.01)
(52) U.S. Cl. ........................... 438/305; 438/563
(58) Field of Classification Search ........ 438/301–305, 438/563
See application file for complete search history.

(56) References Cited

U.S. PATENT DOCUMENTS

| 5,166,101 A * | 11/1992 | Lee et al. ............... 438/763 |
| 5,710,054 A * | 1/1998 | Gardner et al. ........... 438/304 |
| 5,989,966 A * | 11/1999 | Huang ................... 438/305 |
| 6,093,610 A * | 7/2000 | Rodder .................. 438/289 |
| 6,107,129 A | 8/2000 | Gardner et al. |
| 6,124,610 A | 9/2000 | Cheek et al. |
| 6,329,273 B1 * | 12/2001 | Thurgate et al. ........... 438/558 |
| 6,566,212 B1 * | 5/2003 | Yu et al. ................ 438/305 |

FOREIGN PATENT DOCUMENTS

| EP | 0 399 664 A1 | 11/1990 |
| EP | 0 595 484 A1 | 5/1994 |
| JP | 10-12870 | 1/1998 |

* cited by examiner

*Primary Examiner*—Richard A. Booth
(74) *Attorney, Agent, or Firm*—Pillsbury Winthrop Shaw Pittman LLP (57) ABSTRACT

The present invention relates to a method of manufacturing a semiconductor device. According to the present invention, a sidewall layer containing impurities is formed on a part of gate electrode, thereby forming a low concentration source/drain electrode for a lightly doped drain (LDD) structure not by conventional ion implanting process but by out diffusion of impurities contained in the sidewall. Thus, it is made possible to minimizes damages of substrate due to ion implanting process, since the number of process of ion implantation may be naturally minimized through the above mentioned ion implantation process according to the present invention. Also, it is made possible for gate electrode to maintain its size independently, regardless of distance between source electrode and drain electrode, by excluding a role of ion implanting mask which has been performed by gate electrode.

11 Claims, 7 Drawing Sheets

FIGURE 1

(RELATED ART)

FIGURE 2

(RELATED ART)

FIGURE 3

(RELATED ART)

FIGURE 4

(RELATED ART)

METHOD OF MANUFACTURING A SEMICONDUCTOR DEVICE

BACKGROUND OF THE INVENTION

1. Field of the Invention

The present invention relates to a method of manufacturing a semiconductor device which may minimize damages of semiconductor devices due to ion implantation processes by naturally implementing a lightly doped drain (LDD) structure with a minimum processes.

2. Description of the Prior Art

Recently, as the size of semiconductor devices and the channel length of transistors are rapidly reduced, various kinds of defects including a punch-through are also greatly increased in its incidence, in proportion to such reduction of the channel length.

In previous consideration of the defects such as punch-through, the prior art has proposed a method of manufacturing a semiconductor device, wherein an LDD structure is formed to secure a shallow junction between a source electrode and a drain electrode of transistor, and by such LDD structure, an electric field strength between the source and drain electrodes are naturally reduced.

An LDD structure of the prior art is disclosed in U.S. Pat. No. 6,124,610 entitled "Isotropically etching sidewall spacers to be used for both an NMOS source/drain implant and a PMOS LDD implant", U.S. Pat. No. 6,107,129 entitled "Integrated circuit having multiple LDD and/or source/drain implant steps to enhance circuit performance", Japanese Patent Application Publication No. 1998-12870 entitled "Semiconductor devices and manufacturing method thereof", EP399,664 entitled "Forming and removing polysilicon LDD spacers" and EP595,484 entitled "NMOS LDD PMOS HALO IC process for CMOS transistors".

Figure 1:
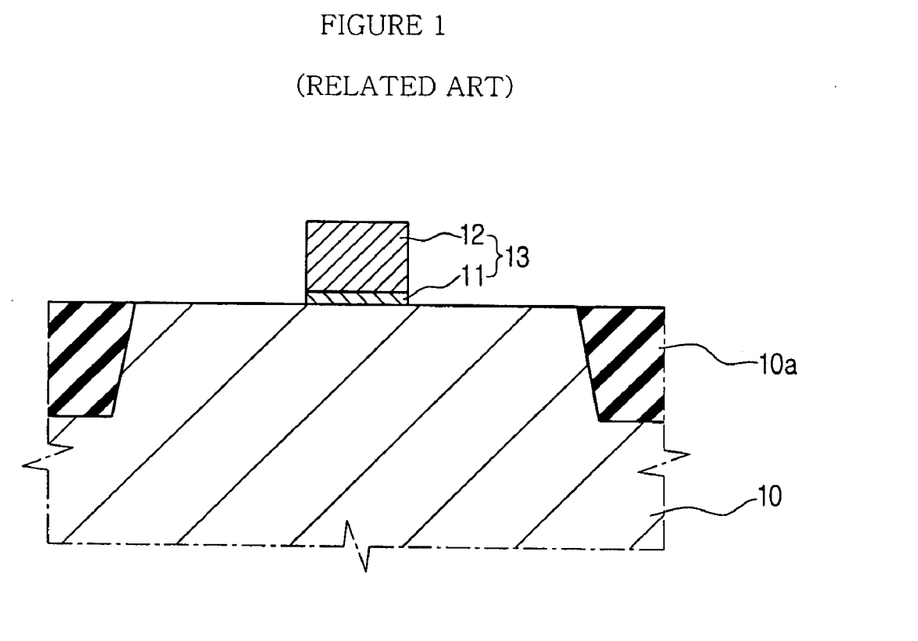
FIGS. 1 to 4 illustrate a procedure of a method of manufacturing a semiconductor device according to the prior art.

First, as shown in FIG. 1, in the prior art, a substrate 10 is provided whose active region is defined by an isolating layer 10a. A gate electrode 13 having a gate oxide layer pattern 11 and a gate poly layer pattern 12 on the active region of the substrate 10 is formed.

Figure 2:
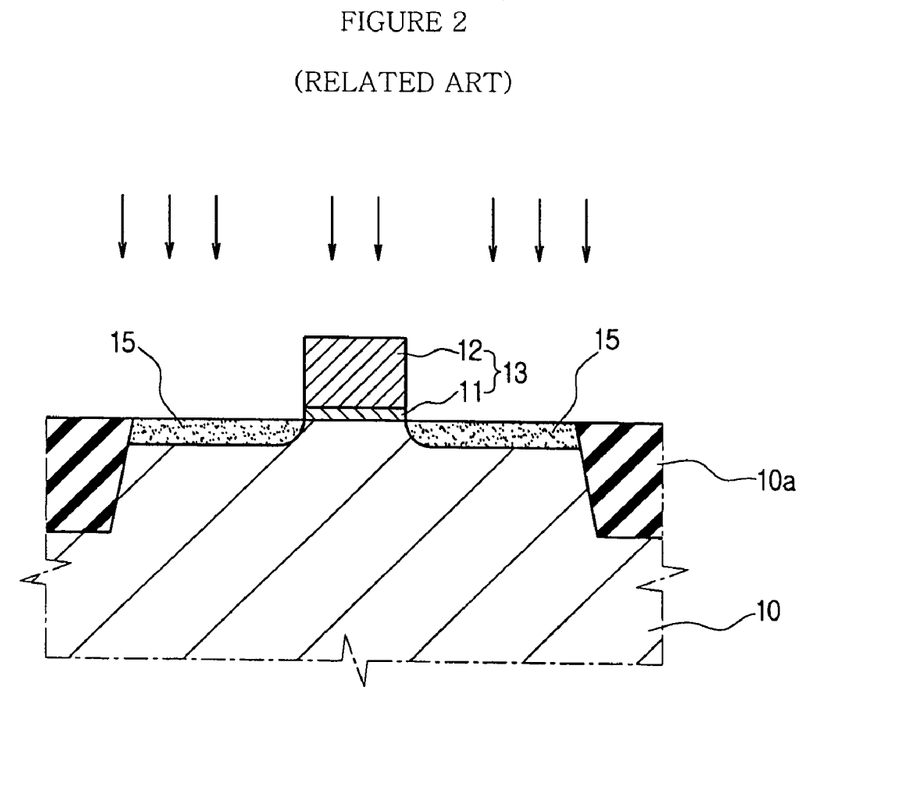

Then, as shown in FIG. 2, by performing an ion implantation process using the gate electrode 13 as an ion-implantation mask, impurities are lightly doped onto the substrate 10, forming a source/drain electrode 15 with low concentration for LDD structure on the substrate 10 adjacent to the gate electrode 13.

Figure 3:
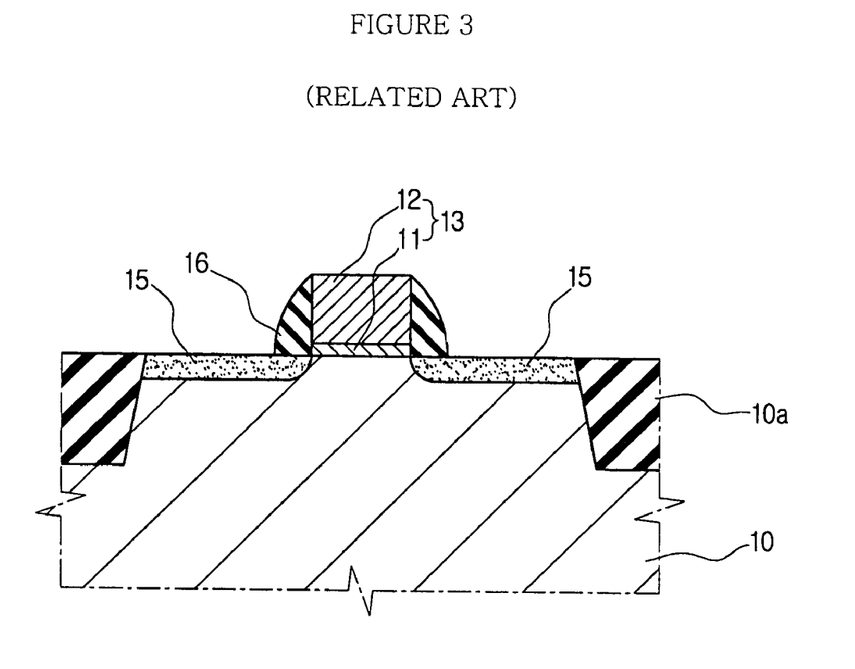

Then, as shown in FIG. 3, spacers 16 are formed on both sidewalls of the gate electrode 13.

Figure 4:
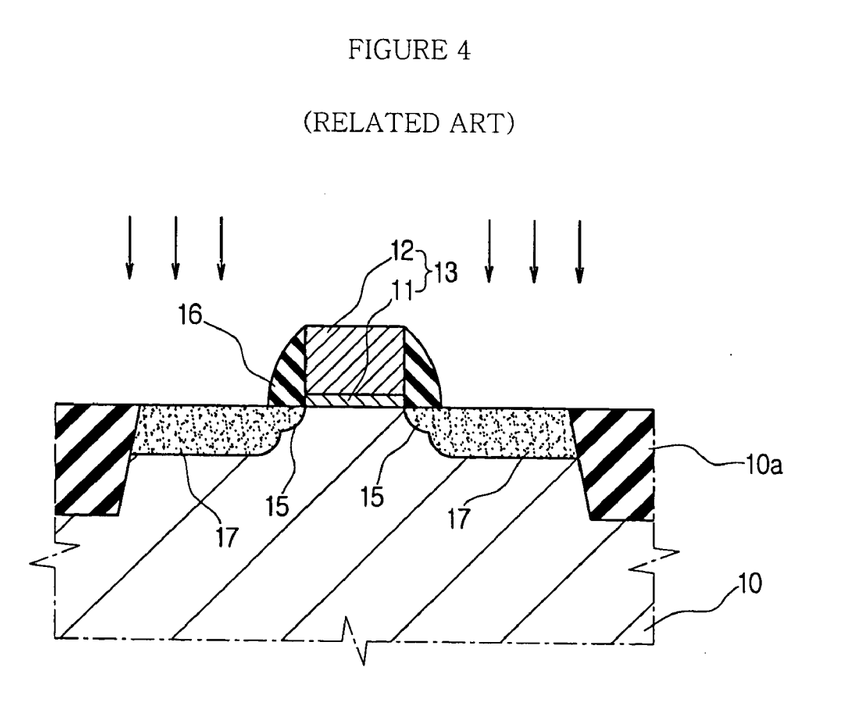

Then, as shown in FIG. 4, by performing an ion implantation using the spacers 16 as an ion implantation mask, impurities with high concentration are implanted into the substrate 10, forming a source/drain electrode 17 with high concentration onto both sides of the gate electrode 13.

Finally, certain subsequent process, such as annealing process, is performed, thus forming a semiconductor device with LDD structure.

In such prior system as described above, in order to form the LDD structure source/drain electrode 15 with low concentration, a process of implanting impurities into the substrate 10 should be preceded, so that certain impact shocks due to implantation of impurities might be applied to the surface of substrate 10, with the result that a lattice structure of partial silicon atoms constituting the surface of substrate 10 being considerably destroyed.

In this case, when certain subsequent process, for example, an annealing process, is forcedly performed without conducting separate measures, partial silicon atoms with their lattice structure destroyed due to impact shocks of impurities become separated from the surface of substrate 10 and then being scattered outside by heat applied during the annealing process, thus generating unnecessary defects such as voids on the surface of substrate 10.

Such voids continuously have a bad influence on a certain construction formed on the substrate 10, so that product quality of finally finished semiconductor devices may be degraded below a certain level unless separate measures are conducted.

Meanwhile, in the prior system, as mentioned above, the source/drain electrode 15 for LDD structure with low concentration is formed by using the gate electrode 13 as an ion implantation mask, so that the gate electrode 13 may have a limit in a size reduction.

The reason of which is because, when the size of the gate electrode 13 has been considerably reduced, a distance between the lightly doped source/drain electrode 15, which is formed dependently by using the gate electrode 13 as an ion implantation mask, becomes so narrower, with the result that the generation of bad phenomenon such as a punch-through being caused.

As a result, in the prior art, nevertheless of current situation in that the size of semiconductor devices being reduced, the size thereof is hardly reduced to the optimum, so that it is difficult to increase a performance of semiconductor devices.

SUMMARY OF THE INVENTION

Accordingly, the present invention has been made to solve the above-mentioned problems occurring in the prior art, and an object of the present invention is to minimize damages of a substrate due to the process of ion implantation by additionally forming a sidewall layer containing certain impurities on a part of a gate electrode to form a lightly doped source/drain electrode for LDD structure through an out diffusion of the impurities contained in the sidewall layer without performing a conventional ion implantation process, thus inducing the natural reduction of the frequency of ion implantation process.

Another object of the present invention is to independently maintain a size of a gate electrode to the minimum irrespective of a distance from a source/drain electrode by forming a lightly doped source/drain electrode for LDD structure through an out diffusion of the impurities contained in a sidewall layer without performing a conventional ion implantation process, thus precluding a given function of an ion implantation mask from a gate electrode.

In order to accomplish at least the above objects, in whole or in parts, there is provided a method of manufacturing a semiconductor device, including: forming a gate electrode on a semiconductor substrate; forming a first sidewall layer on both sides of the gate electrode; forming a second sidewall layer containing impurities on both sides of the first sidewall layer; forming a first impurity region on the semiconductor substrate by out-diffusing the impurities contained in the second sidewall layer; forming a spacer on both sides of the first sidewall layer; and forming a second impurity region on other part of the active region by implanting the impurities thereto using the spacer as an ion implantation mask.

Preferably, the dose of the impurities contained in the second sidewall layer may be $1 \times 10^{19}/cm^3$ to $1 \times 10^{23}/cm^3$. And, more preferably, the dose of the impurities contained in the second sidewall layer may be $1 \times 10^{20}/cm^3$.

Preferably, said forming the second sidewall layer includes: forming an undoped layer on the semiconductor substrate to cover the first sidewall layer and the gate electrode; ion-implanting impurities using the undoped layer as a target; and selectively etching the undoped layer in such a way that the undoped layer is left only on both sides of the first sidewall layer. Preferably, the undoped layer may be composed of any one of $SiO_2$, $Si_3N_4$ and SiON.

Preferably, said forming the second sidewall layer includes: forming a doped layer containing impurities on the semiconductor substrate to cover the first sidewall layer and the gate electrode, using a plasma deposition; and selectively etching the doped layer in such a way that the doped layer is left only on both sides of the first sidewall layer.

Preferably, the impurities contained in the second sidewall layer may be out-diffused toward the substrate by an annealing process. Preferably, the method of manufacturing a semiconductor device according to the present invention may further include removing the second sidewall layer before forming the spacer.

Preferably, said forming the first sidewall layer includes: forming a first insulating layer on the substrate to cover the gate electrode; forming a second insulating layer on the first insulating layer; and selectively etching the first and second insulating layers in such a way that the first and second insulating layers are left only on both sides of the gate electrode. Preferably, the first insulating layer may be an oxide layer and the second insulating layer may be a nitride layer.

Meanwhile, according to another aspect of the present invention, there is provided a method of manufacturing a semiconductor device, including: forming a gate electrode on a semiconductor substrate; forming a first sidewall layer on both sides of the gate electrode; forming a second sidewall layer containing impurities on both sides of the first sidewall layer; forming a first impurity region on the semiconductor substrate by out-diffusing the impurities contained in the second sidewall layer; and forming a second impurity region on other part of the active region by implanting the impurities thereto using the second sidewall layer as an ion implantation mask.

Preferably, the dose of the impurities contained in the second sidewall layer may be $1\times10^{19}/cm^3$ to $1\times10^{23}/cm^3$. And, more preferably, the dose of the impurities contained in the second sidewall layer may be $1\times10^{20}/cm^3$.

Preferably, said forming the second sidewall layer includes: forming an undoped layer on the substrate to cover the first sidewall layer and the gate electrode; ion-implanting impurities using the undoped layer as a target; and selectively etching the undoped layer in such a way that the undoped layer is left only on both sides of the first sidewall layer. Preferably, the undoped layer may be composed of any one of $SiO_2$, $Si_3N_4$ and SiON.

Preferably, said forming the second sidewall layer includes: forming a doped layer containing impurities on the substrate to cover the first sidewall layer and the gate electrode, using a plasma deposition; and selectively etching the doped layer in such a way that the doped layer is left only on both sides of the first sidewall layer.

Preferably, the impurities contained in the second sidewall layer may be out-diffused toward the substrate by an annealing process.

Preferably, said forming the first sidewall layer includes: forming a first insulating layer on the substrate to cover the gate electrode; forming a second insulating layer on the first insulating layer; and selectively etching the first and second insulating layers in such a way that the first and second insulating layers are left only on both sides of the gate electrode. Preferably, the first insulating layer may be an oxide layer and the second insulating layer may be a nitride layer.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings. In the following description and drawings, the same reference numerals are used to designate the same or similar components, and so repetition of the description of the same or similar components will be omitted.

Figure 5:
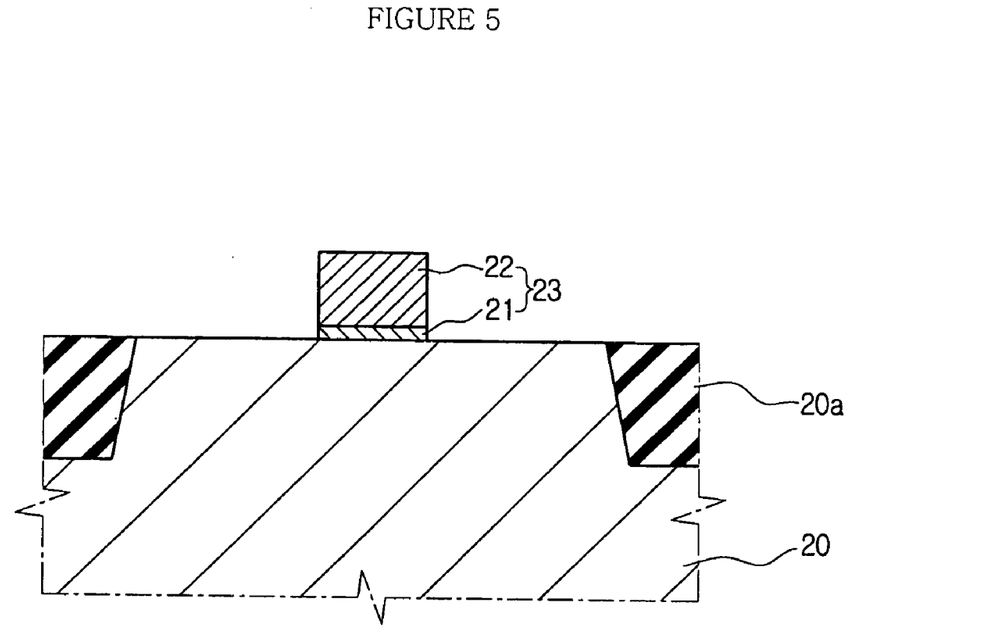
FIGS. 5 to 13 illustrate a procedure of a method of manufacturing a semiconductor device according to the embodiments of the present invention.

As shown in FIG. 5, a trench is formed in a device isolating region of a substrate 20 by utilizing sacrificial layer patterns, for example, a nitride layer pattern, a sacrificial oxide layer pattern and so forth, and a series of a gap-filling process of an insulating layer, a patterning process and so forth are further performed, thus forming a device isolating layer 20a defining an active region.

Then, a gate insulating layer and a poly silicon layer are successively deposited on the substrate 20 by a chemical vapor deposition (CVD) process, and using a photolithography, the gate insulating layer and the poly silicon layer are collectively patterned, so that a gate electrode 23 having a gate insulating layer pattern, for example, a gate oxide layer pattern 21 and a gate poly layer pattern 22 is formed on a part of the active region of the substrate 20 defined by the device isolating layer 20a.

Figure 6:
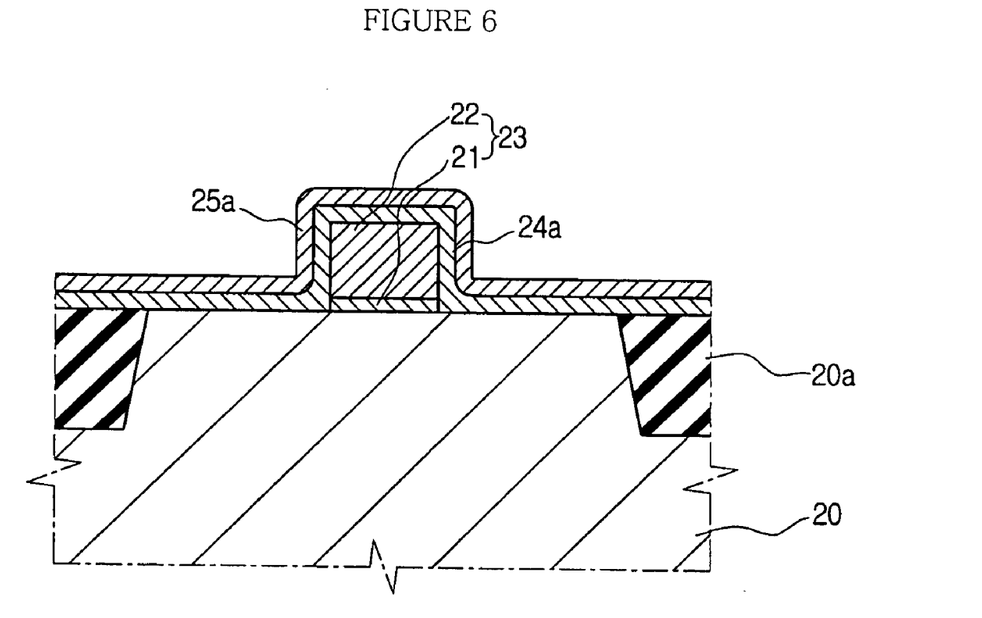

When the gate electrode 23 has been formed through the foregoing processes, using CVD process as shown in FIG. 6, a first insulating layer 24a, for example, an oxide layer, is formed on the substrate 20 to cover the gate electrode 23, and, then, a second insulating layer 25a, for example, a nitride layer, is formed on the first insulating layer 24a.

Figure 7:
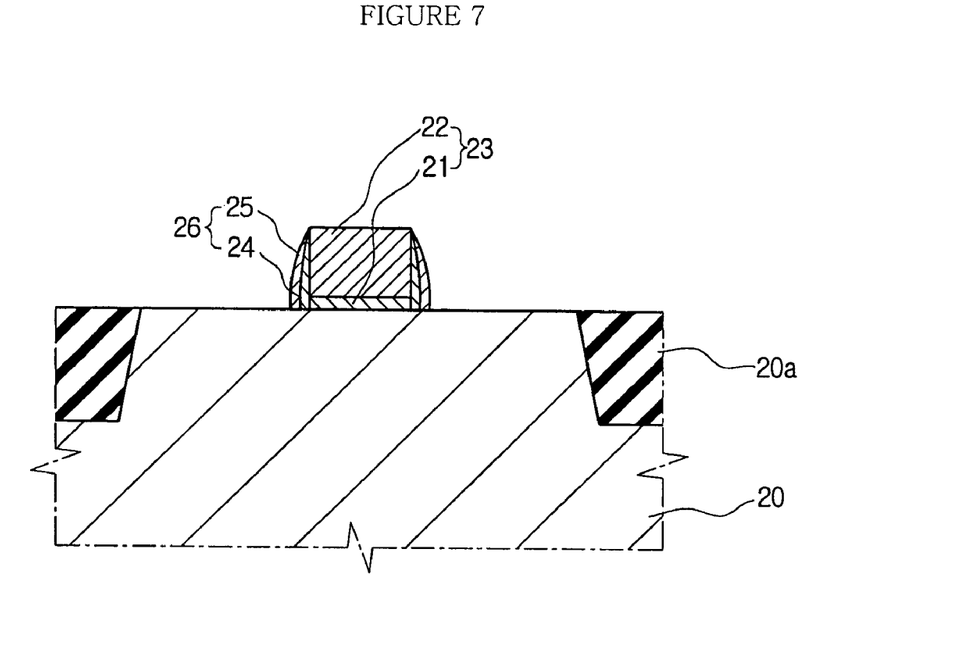

Then, as shown in FIG. 7, using a dry etching process having an anisotropic etching feature, for example, a reactive ion etching process, the first and second insulating layers 24a and 25a are selectively etched in such a way that the first and second insulating layers 24a and 25a are left only on both sides of the gate electrode 23, thus forming a first sidewall layer 26 consisting of, for example, an oxide layer pattern 24 and a nitride layer pattern 25, on both sides of the gate electrode 23.

When the first sidewall layer 26 has been formed through the foregoing processes, a step of forming a second sidewall layer 27 containing impurities on both sides of the first sidewall layer 26 is conducted. The second sidewall layer 27 can be formed according to two following methods.

Figure 8A:
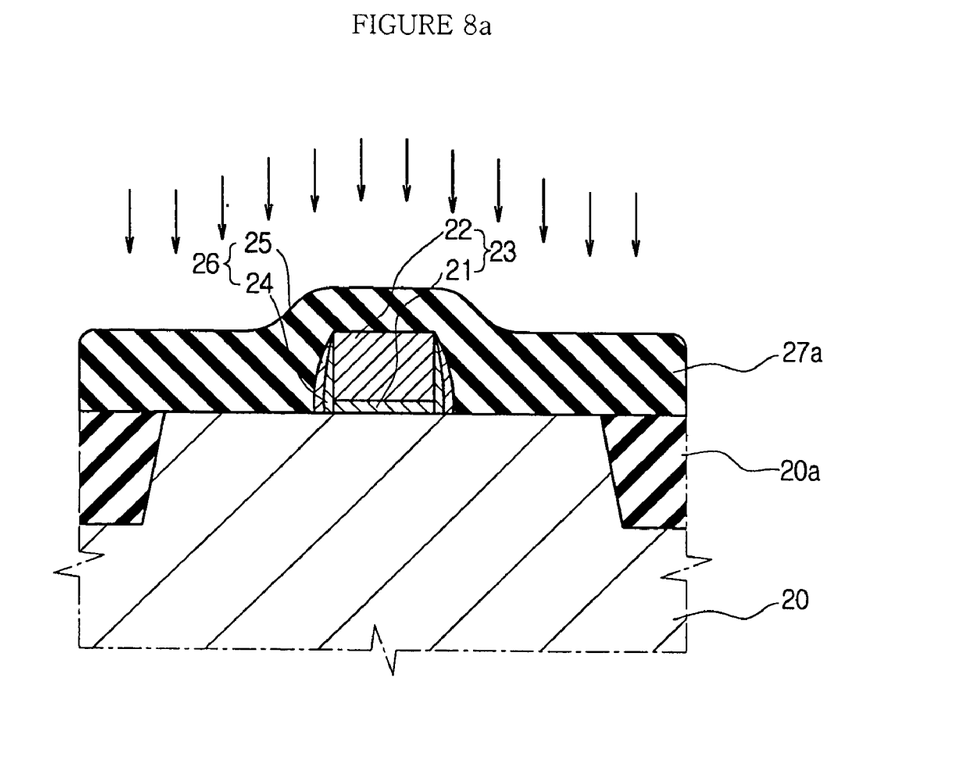

For example, as shown in FIG. 8a, using CVD process, an undoped layer 27a, for example, any one of $SiO_2$, $Si_3N_4$ and SiON, is formed on the substrate to cover the first sidewall layer 26 and the gate electrode 23.

Then, using the undoped layer 27a as a target, impurities, for example, boron or phosphorous, are ion-implanted.

Figure 9:
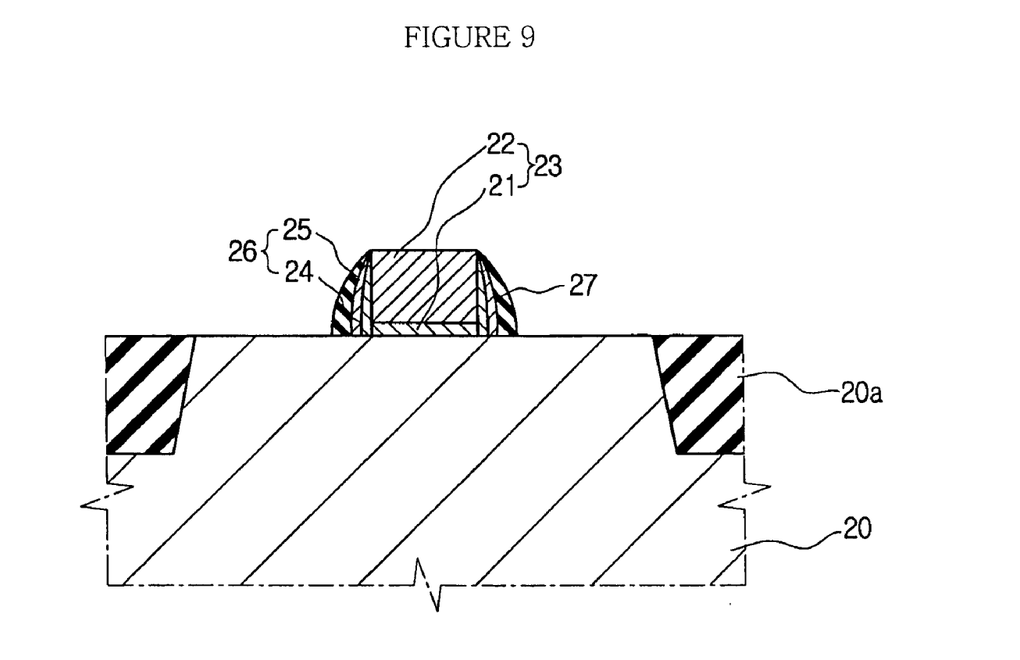

As shown in FIG. 9, using the dry etching process having an anisotropic etching feature, for example, a reactive ion etching process, the undoped layer 27a containing impurities is selectively etched in such a way that the undoped layer is left only on both sides of the first sidewall layer 26, thus forming the second sidewall layer 27 containing impurities (Boron or Phosphorous) on both sides of the first sidewall layer 26. Preferably, the dose of the impurities contained in the second sidewall layer 27 may be $1\times10^{19}/cm^3$ to $1\times10^{23}/cm^3$. And, more preferably, the dose of impurities contained in the second sidewall layer 27 may be $1\times10^{20}/cm^3$.

Figure 8B:
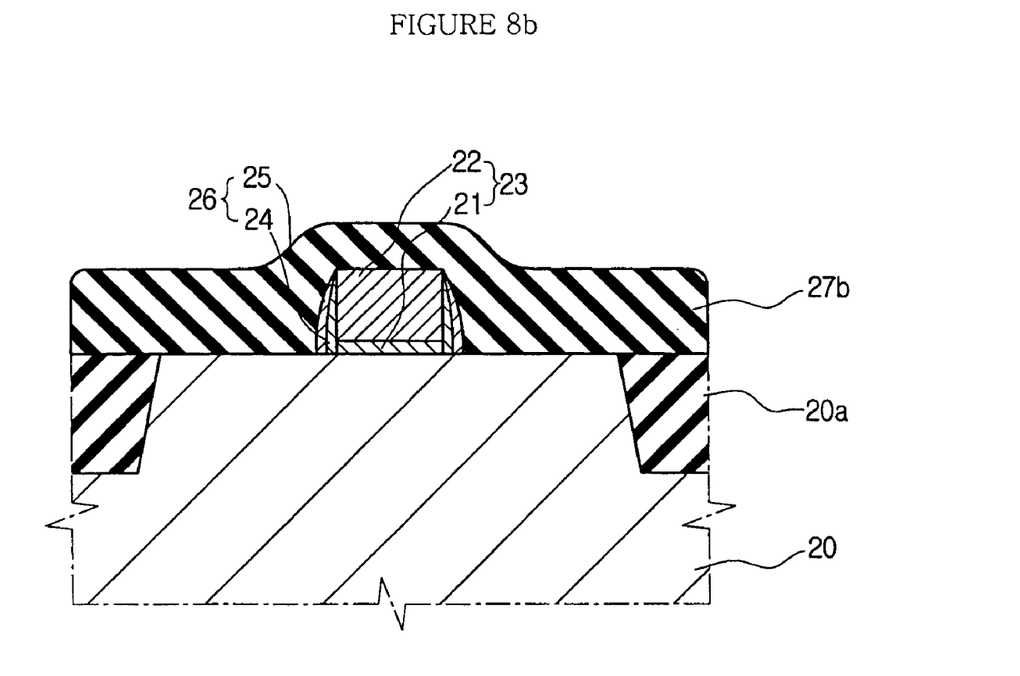

In alternative embodiment, as shown in FIG. 8b, a plasma deposition process using source gas containing impurities (for example, boron or phosphorous) is performed, so that a doped layer 27b containing impurities (Boron or Phosphorous) is formed collectively on the substrate 20 to cover the first sidewall layer 26 and the gate electrode 23.

Then, as shown in FIG. 9, using the dry etching process having an anisotropic etching feature, for example, a reactive ion etching process, the doped layer 27b containing impurities is selectively etched in such a way that the doped layer is left only on both sides of the first sidewall layer 26, thus forming the second sidewall layer 27 containing impurities (Boron or Phosphorous) on both sides of the first sidewall layer 26. Preferably, the dose of the impurities contained in the second sidewall layer 27 may be $1\times10^{19}/cm^3$ to $1\times10^{23}/cm^3$. And, more preferably, the dose may be $1\times10^{20}/cm^3$.

As described above, in the present invention, the second sidewall layer 27 can be formed by a process of forming the undoped layer 27a and implanting impurities to the undoped layer 27a, or another process of collectively forming the doped layer 27b containing impurities using a plasma treatment.

Herein, if the impurities contained in the second sidewall layer 27 are boron, the second sidewall layer 27 constitutes a boron silicate glass (BSG) layer. If the impurities contained in the second sidewall layer 27 are phosphorous, the second sidewall layer 27 constitutes a phosphorous silicate glass (PSG) layer.

In the embodiments described above, since the first sidewall layer 26 is previously formed on both sides of the gate electrode 23, the gate electrode 23 is stably maintained at normal state without being damaged even though a series of processes for forming the second sidewall layer 27 are severely conducted. In this case, as described before, the first sidewall layer 26 has a dual structure that the oxide layer pattern 24 and the nitride layer pattern 25 are overlapped, so that the first sidewall layer 26 can effectively perform a given function of protecting the gate electrode 23.

Figure 10:
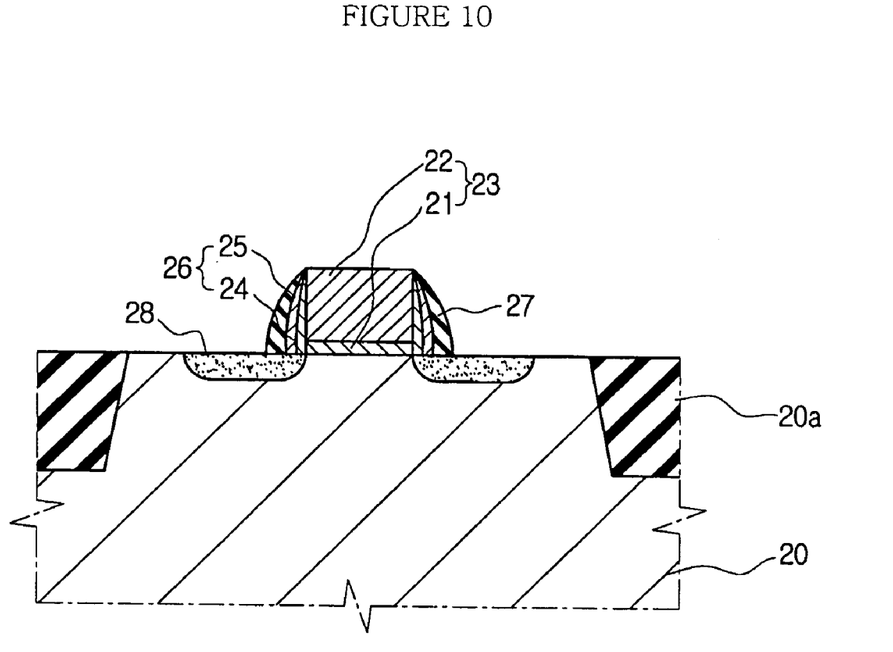

Meanwhile, when the second sidewall layer 27 has been formed on both sides of the first sidewall layer 26 through processes described before, the substrate 20 on which respective constructions thereof have been formed is transferred to, for example, a diffusion furnace, as shown in FIG. 10, high temperature annealing process is performed in the diffusion furnace as to naturally out-diffuse the impurities contained in the second sidewall layer 27 toward the substrate 20, thus forming a first impurity region, for example, a lightly doped source/drain electrode 28 for LDD structure, on the active region of the substrate 20 corresponding to the both sides of the gate electrode 23.

Of course, in consideration of such out-diffusion state, the second sidewall layer 27 contains impurities of, preferably, $1\times10^{19}/cm^3$ to $1\times10^{23}/cm^3$, or more preferably, of $1\times10^{20}/cm^3$, so that the lightly doped source/drain electrode 28 formed after the annealing process maintains its quality corresponding to that of the conventional source/drain electrode formed by an ion implantation process.

In the conventional system, in order to form the lightly doped source/drain electrode for LDD structure, an implantation of impurities into the substrate should be preceded, so that certain impact shocks due to implantation of impurities might be applied to the surface of substrate, with the result that a lattice structure of partial silicon atoms constituting the surface of substrate 10 being considerably destroyed.

However, in the present invention, the lightly doped source/drain electrode for LDD structure 28 is formed not by conventional ion implantation process but by an out-diffusion of the impurities contained in the second sidewall layer 27, inducing the natural reduction of the frequency of ion implantation process, thus minimizing damages of the substrate 20 due to the process of ion implantation.

Also, in the conventional system, the lightly doped source/drain electrode for LDD structure is formed using the gate electrode as an ion implantation mask, so that, if the size of the gate electrode is so reduced, a distance therebetween becomes so close and it causes a problem in that total channel length is shortened. Thus, it is difficult to reduce size of the gate electrode.

However, in the present invention, the lightly doped source/drain electrode for LDD structure 28 is formed not by conventional ion implantation process but by an out-diffusion of the impurities contained in the second sidewall layer 27, precluding a given function of an ion implantation mask from the gate electrode 23, thus independently maintaining a size of the gate electrode to the minimum irrespective of a distance between the source/drain electrodes.

Figure 11:
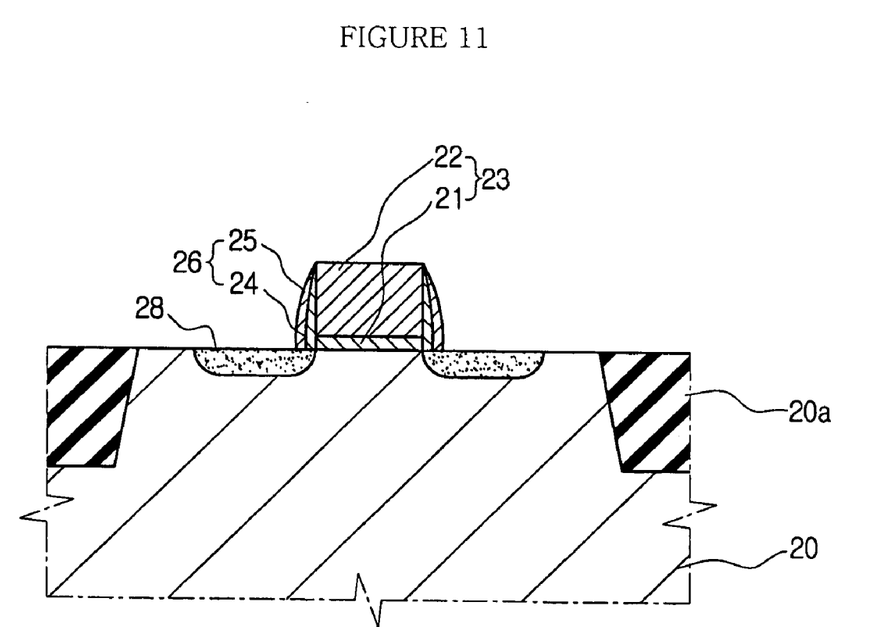

Meanwhile, when the lightly doped source/drain electrode 28 has been formed through processes described above, as shown in FIG. 11, the second sidewall layer 27 that has been formed on both sides of the first sidewall layer 26 is removed using the etching process. In this case, since the first sidewall layer 26 is previously formed on both sides of the gate electrode 23, the gate electrode 23 is stably maintained at normal state without being damaged even though a series of processes for removing the second sidewall layer 27 are severely conducted. Of course, as described above, the first sidewall layer 26 has a dual structure that the oxide layer pattern 24 and the nitride layer pattern 25 are overlapped, so that the first sidewall layer 26 can effectively perform a given function of protecting the gate electrode 23.

Figure 12:
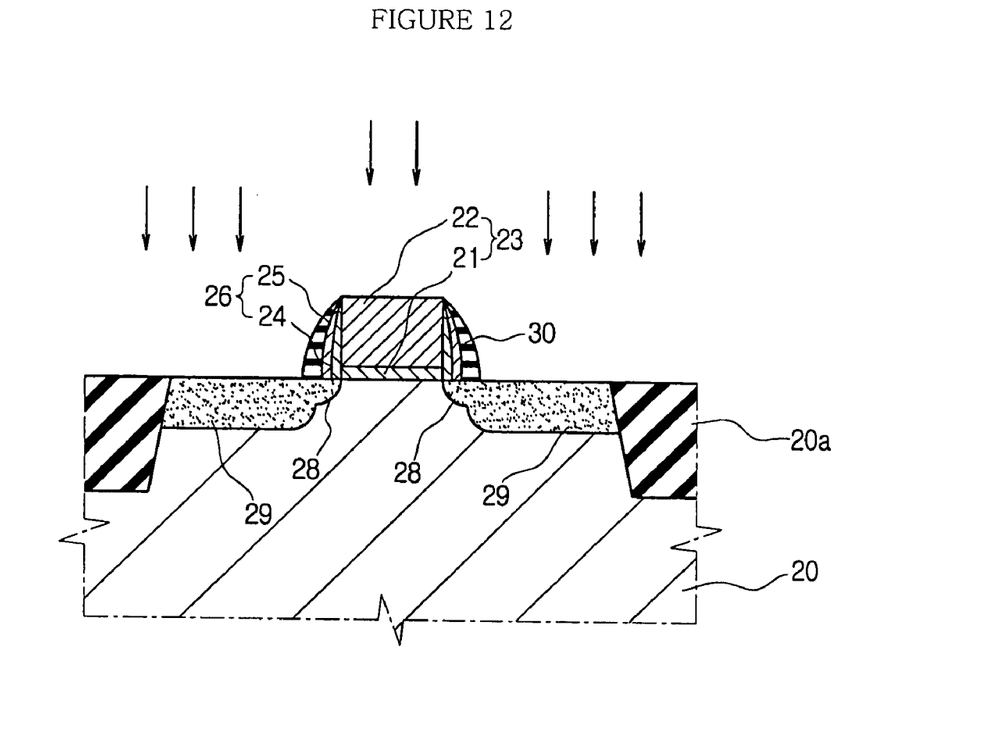

When the second sidewall layer 27 has been removed through the foregoing process, an insulating layer, for example, an oxide layer, is formed on the substrate 20 to cover the first sidewall layer 26 and the gate electrode 23, using CVD process, and as shown in FIG. 12, using a dry etching process having an anisotropic etching feature, for example, a reactive ion etching process, the insulating layer is selectively etched in such a way that the insulating layer is left only on both sides of the first sidewall layer 26, thus forming a spacer 30 on both sides of the first sidewall layer 26.

Then, performing an ion implantation process using the spacer 30 as an ion implantation mask, impurities with high concentration are implanted into the substrate 20, thus forming a heavily doped source/drain electrode 29 on both sides of the gate electrode 23.

After foregoing processes, a certain subsequent process, for example, an annealing process, is performed so that LDD structure semiconductor devices, for example, transistors, are completely formed.

Meanwhile, in the foregoing embodiment, the second sidewall layer 27 is removed after the lightly doped source/drain electrode 28 for LDD structure is formed, but, according to a second embodiment of the present invention, the second sidewall layer 27 can be continuously left even after the formation of the lightly doped source/drain electrode 28, so as to serve as an ion implantation mask for forming, for example, the heavily doped source/drain electrode 29. In this case, the manufacturer has a profit in that the spacer 30 needs not to be formed additionally.

According to the second embodiment of the present invention, as shown in FIGS. 5 to 10, forming the gate electrode 23 on a part of the active region of a substrate 20; forming a first sidewall layer 26 on both sides of the gate electrode 23; forming a second sidewall layer 27 containing impurities on both sides of the first sidewall layer 26; and forming the lightly doped source/drain electrode 28 for LDD structure on a part of the active region by out-diffusing the impurities contained in the second sidewall layer 27 toward the substrate 20.

Figure 13:
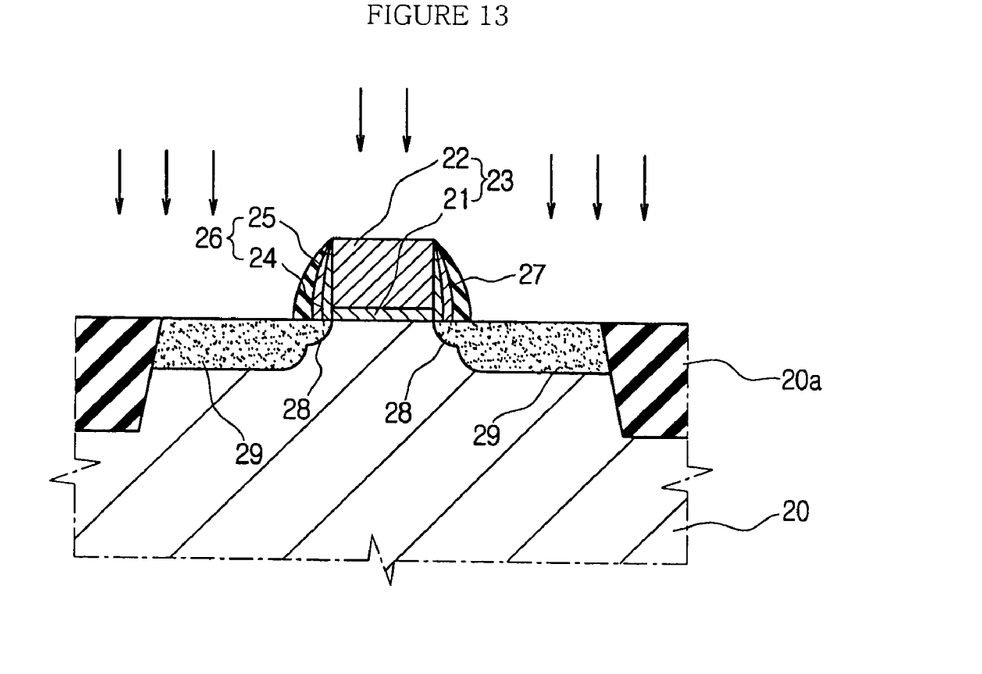

Then, as shown in FIG. 13, performing an ion implantation process using the second sidewall layer 27 as an ion implantation mask, impurities with high concentration are implanted into the substrate 20, thus forming the heavily doped source/drain electrode 29 on both sides of the gate electrode 23.

After foregoing processes, a certain subsequent process, for example, an annealing process; is performed so that LDD structure semiconductor devices, for example, transistors, are completely formed.

Also, in this embodiment of the present invention, the lightly doped source/drain electrode 28 for LDD structure is formed not by conventional ion implantation process but by an out-diffusion of the impurities contained in the second sidewall layer 27, so that the manufacturer can obtain advantages in that "damages of the substrate 20 being minimized" and in that "a size of the gate electrode 23 being independently minimized irrespective of a distance from the lightly doped source/drain electrode 28".

According to the embodiments of the present invention as described above, the present invention is to minimize damages of a substrate due to the process of ion implantation by additionally forming a sidewall layer containing certain impurities on a part of a gate electrode to form a lightly doped source/drain electrode for LDD structure through an out diffusion of the impurities contained in the sidewall layer without performing a conventional ion implantation process, thus inducing the natural reduction in the number of ion implantation process.

Also, the present invention is to independently maintain a size of a gate electrode to the minimum irrespective of a distance between a source/drain electrode by forming a lightly doped source/drain electrode for LDD structure through an out diffusion of the impurities contained in a sidewall layer without performing a conventional ion implantation process, thus precluding a given function of an ion implantation mask from a gate electrode.

Although preferred embodiments of the present invention have been described for illustrative purposes, those skilled in the art will appreciate that various modifications, additions and substitutions are possible, without departing from the scope and spirit of the invention as disclosed in the accompanying claims.

The entire disclosure of Korean Patent Application No. 10-2002-87286 file on Dec. 30, 2002 including specification, claims, drawings and summary are incorporated herein by reference in its entirety.

What is claimed is:

1. A method of manufacturing a semiconductor device, comprising:
    forming a gate electrode on a semiconductor substrate;
    forming an oxide and nitride layers as a first sidewall layer on both sides of the gate electrode by CVD to cover the gate electrode;
    depositing an undoped layer composed of any one of $SiO_2$, $Si_3N_4$, and SiON on the semiconductor substrate to cover the oxide layer and the gate electrode;
    forming a doped layer by ion-implanting impurities using the undoped layer as a target;
    selectively etching the oxide and doped layers in such a way that the first sidewall and doped layers are left only on both sides of the gate electrode;
    forming an LDD region on the semiconductor substrate by out-diffusing the impurities contained in the doped layer;
    removing the doped layer;
    forming a spacer on both sides of the first sidewall layer; and
    forming a source/drain region on other part of the active region by implanting the impurities thereto using the spacer as an ion implantation mask.

2. The method of claim 1, wherein the does of the impurities contained in the second sidewall layer is $1 \times 10^{19}/cm^3$ to $1 \times 10^{23}/cm^3$.

3. The method of claim 2, wherein the does of the impurities contained in the second sidewall layer is $1 \times 10^{20}/cm^3$.

4. The method of claim 1, wherein the impurities contained in the second sidewall layer are out-diffused toward the substrate by an annealing process.

5. The method of claim 1, further comprises removing the second sidewall layer before forming the spacer.

6. The method of claim 1, wherein the impurities are boron or phosphorous.

7. A method of manufacturing a semiconductor device, comprising:
    forming a gate electrode on a semiconductor substrate;
    forming an oxide and nitride layers as a first sidewall layer on both sides of the gate electrode by CVD to cover the gate electrode;
    depositing an undoped layer composed of any one of $SiO_2$, $Si_3N_4$, and SiON on the semiconductor substrate to cover the oxide layer and the gate electrode;
    forming a doped layer by ion-implanting impurities using the undoped layer as a target;
    selectively etching the oxide and doped layers in such a way that the first sidewall and doped layers are left only on both sides of the gate electrode;
    forming an LDD region on the semiconductor substrate by out-diffusing the impurities contained in the doped layer; and
    forming a source/drain region on another part of the active region by implanting the impurities thereto using the doped layer as an ion implantation mask.

8. The method of claim 7, wherein the does of the impurities contained in the second sidewall layer is $1 \times 10^{19}/cm$ to $1 \times 10^{23}/cm^3$.

9. The method of claim 8, wherein the does of the impurities contained in the second sidewall layer is $1\times10^{20}/cm^3$.

10. The method of claim 7, wherein said forming the second sidewall layer comprises:
   forming a doped layer containing impurities on the substrate to cover the first sidewall layer and the gate electrode, using a plasma deposition; and
   selectively etching the doped layer in such a way that the doped layer is left only on both sides of the first sidewall layer.

11. The method of claim 7, wherein the impurities contained in the second sidewall layer are out-diffused toward the substrate by an annealing process.

* * * * *